(12) United States Patent
Roehrer

(10) Patent No.: US 11,081,599 B2
(45) Date of Patent: Aug. 3, 2021

(54) SINGLE PHOTON AVALANCHE DIODE AND ARRAY OF SINGLE PHOTON AVALANCHE DIODES

(71) Applicant: ams AG, Premstaetten (AT)

(72) Inventor: Georg Roehrer, Premstaetten (AT)

(73) Assignee: AMS AG, Premstaetten (AT)

( * ) Notice: Subject to any disclaimer, the term of this patent is extended or adjusted under 35 U.S.C. 154(b) by 24 days.

(21) Appl. No.: 16/636,692

(22) PCT Filed: Jul. 26, 2018

(86) PCT No.: PCT/EP2018/070328
§ 371 (c)(1),
(2) Date: Feb. 5, 2020

(87) PCT Pub. No.: WO2019/030009
PCT Pub. Date: Feb. 14, 2019

(65) Prior Publication Data
US 2020/0168748 A1    May 28, 2020

(30) Foreign Application Priority Data
Aug. 10, 2017   (EP) .................................... 17185766

(51) Int. Cl.
*H01L 31/107*    (2006.01)
*H01L 31/0216*   (2014.01)
*H01L 27/144*    (2006.01)

(52) U.S. Cl.
CPC .... *H01L 31/02164* (2013.01); *H01L 27/1446* (2013.01); *H01L 31/107* (2013.01)

(58) Field of Classification Search
None
See application file for complete search history.

(56) References Cited

U.S. PATENT DOCUMENTS 10,985,201 B2 *   4/2021   Sze ................... H01L 27/14636
2014/0104474 A1 * 4/2014   Tange ............... H01L 27/14685
                                                          348/308

(Continued)

FOREIGN PATENT DOCUMENTS

| JP | S60-170255 | 9/1985 |
| WO | 2014/202995 | 12/2014 |

OTHER PUBLICATIONS

European Search Report for International Search Report for PCT/EP2018/070328 dated Oct. 1, 2018.

*Primary Examiner* — Benjamin P Sandvik
(74) *Attorney, Agent, or Firm* — MH2 Technology Law Group LLP

(57) ABSTRACT

A single photon avalanche diode, SPAD, comprises an active area which is arranged to generate a photon triggered avalanche current. A cover is arranged on or above the active area. The cover shields the active area from incident photons. The cover comprises a stack of at least the first and a second metal layer. At least one of the metal layers, e.g. the first metal layer, comprises an aperture. The metal layers are arranged in the stack with respect to an optical axis such as to open an effective aperture along the optical axis. By way of the effective aperture a portion of the active area is exposed to incident photons being incident along the optical axis. The effective aperture is smaller than the aperture arranged in the first metal layer.

15 Claims, 6 Drawing Sheets

(56) References Cited

U.S. PATENT DOCUMENTS

2015/0293021 A1  10/2015 Finkelstein et al.
2016/0056185 A1   2/2016 Macleod et al.
2016/0284743 A1   9/2016 Mellot et al.
2019/0181177 A1*  6/2019 Kobayashi ........ H01L 27/14636

* cited by examiner

FIG 2
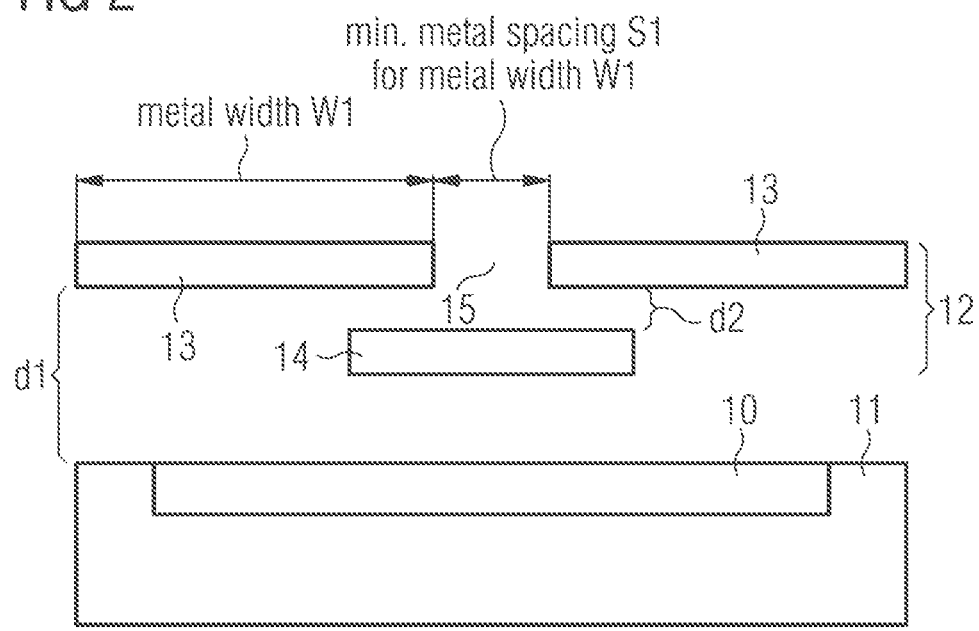
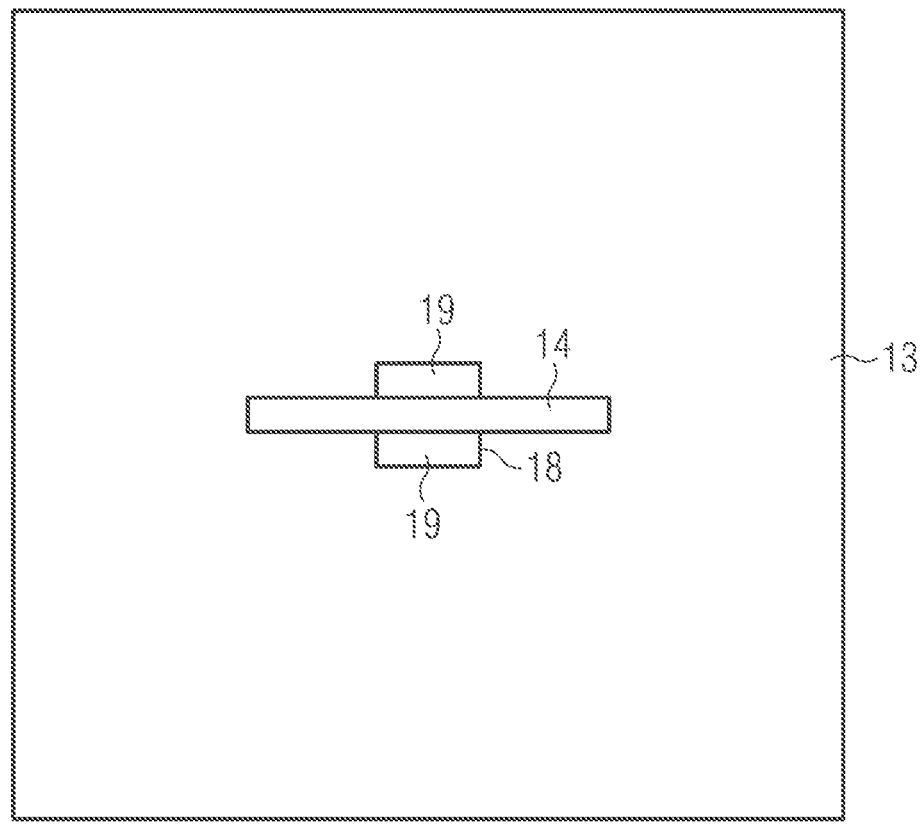

FIG 4
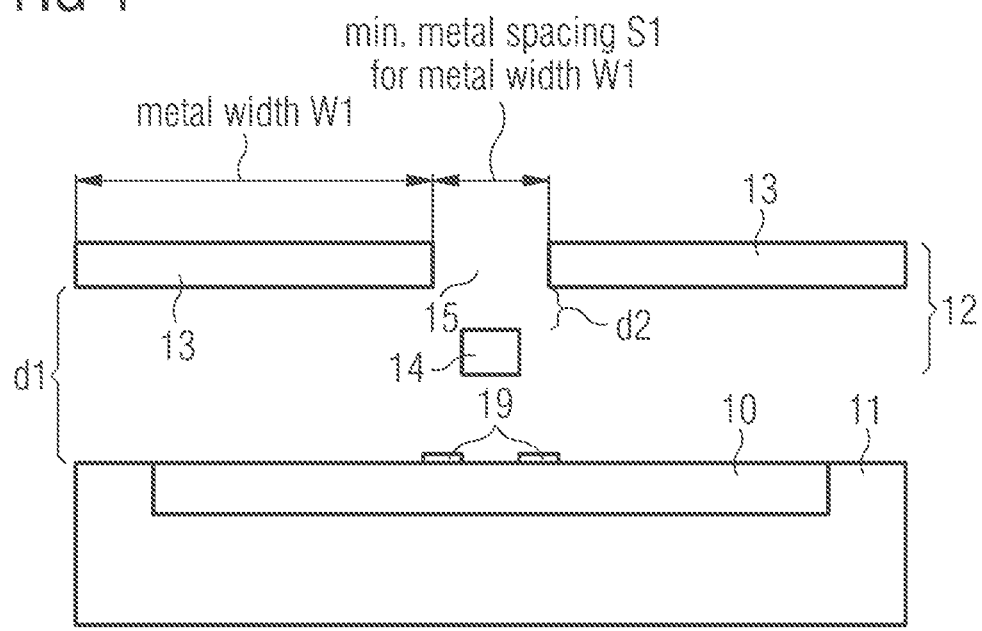
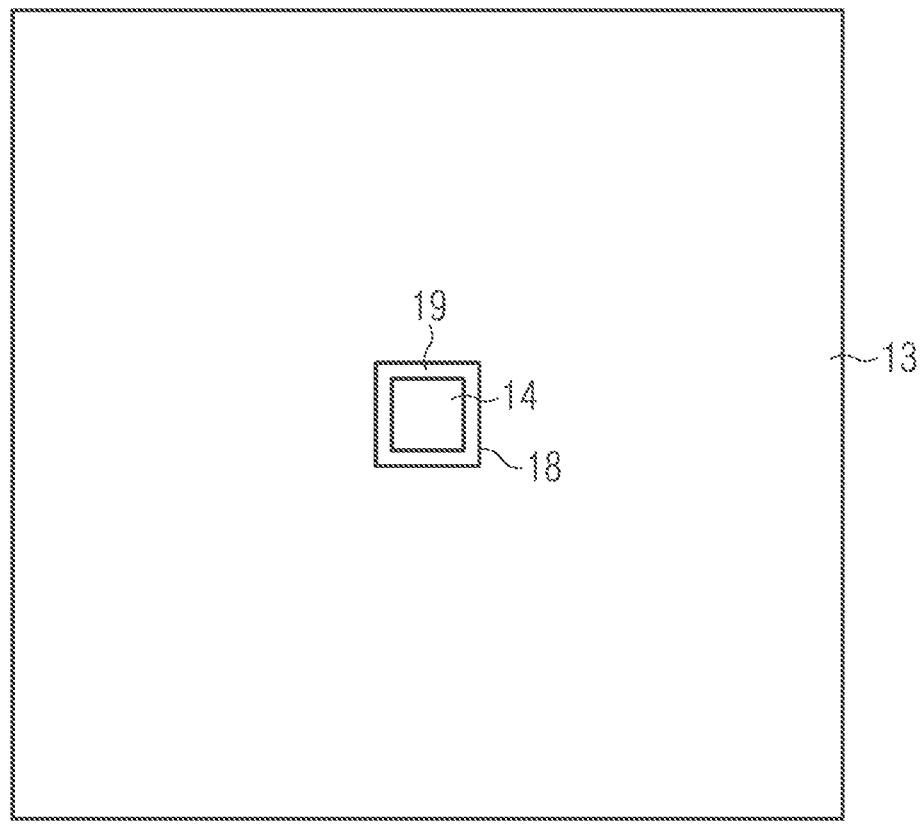

SINGLE PHOTON AVALANCHE DIODE AND ARRAY OF SINGLE PHOTON AVALANCHE DIODES

CROSS-REFERENCE TO RELATED APPLICATIONS

The present application is the national stage entry of International Patent Application No. PCT/EP2018/070328, filed on Jul. 26, 2018, which claims the benefit of priority of European Patent Application No. 17185766.7, filed on Aug. 10, 2017, all of which are hereby incorporated by reference in their entirety for all purposes.

BACKGROUND OF THE INVENTION

A single photon avalanche diode, SPAD for short, is a solid-state photodetector based on a pn-junction biased beyond its breakdown region. The bias voltage generates an electric field of high electric field strength. In fact, a single photon may generate a charge carrier in a depletion layer of the SPAD that, in turn, triggers an avalanche current due to an impact ionization mechanism. Once triggered for a certain period the avalanche is quenched, either actively or passively, to allow the device to be "reset" in order to again detect further photons. After the avalanche breakdown is stopped, the SPAD is recharged to its excess bias voltage, i.e. the voltage above breakdown voltage. During this so called dead time, however, the SPAD cannot detect photons.

The linear range of a SPAD is limited by the dead time as the SPAD output to incident light intensity becomes increasingly non-linear as intensity increases. Cover structures have been proposed in order to extend the linear response of SPADs. For example, a metal aperture covering the SPAD can be designed to limit an amount of incident photons. Furthermore, a high count rate due to a high photon count causes a high current. Thus, attenuation of the SPAD has the additional effect to reduce current consumption.

Attenuation of a SPAD can be required under high ambient light conditions and a strong signal (without a strong signal the signal may be lost in the noise). A non-attenuated SPAD can be required for moderate to low ambient light conditions and a weaker signal. Thus attenuated and non-attenuated SPADs may be provided as an array together on the same chip to adjust for varying lighting conditions. For example, non-attenuated SPADs are deactivated under high ambient light conditions.

The maximum achievable attenuation is typically limited by the design rules for the used metal layer. E.g. for a SPAD with an active area of 50 $\mu m^2$ and a desired attenuation of 0.5%, the cover (e.g. a metal shield) could have a square aperture which is required to be 0.5×0.5 $\mu m^2$. However, in some SPAD manufacturing technology this may violate the metal to metal spacing rules and/or the metal enclosed area rules. For example, for metal lines exceeding the minimum metal width, the minimum spacing rules are typically much larger than the possible minimum spacing in a certain technology. Furthermore, the maximum metal width and/or the maximum metal density typically is also limited.

SUMMARY OF THE INVENTION

It is to be understood that any feature described in relation to any one embodiment may be used alone, or in combination with other features described hereinafter, and may also be used in combination with one or more features of any other of the embodiments, or any combination of any other of the embodiments, unless explicitly described as an alternative. Furthermore, equivalents and modifications not described below may also be employed without departing from the scope of the proposed single photon avalanche diode and array of single photon avalanche diodes as defined in the accompanying claims.

The following relates an improved concept in the field of single photon avalanche diodes, SPADs, and array of such SPADs. The concept provides means to extend attenuation of SPADs by modifying a cover, e.g. by using a combination of two or more metal layers. In fact, the practically achievable attenuation can be extended to smaller values, e.g. less than 1% for typical active areas.

In at least one embodiment a single photon avalanche diode, SPAD, comprises an active area which is arranged to generate a photon triggered avalanche current. A cover is arranged on or above the active area. The cover shields the active area from incident photons. The cover comprises a stack of at least the first and a second metal layer.

At least one of the metal layers, e.g. the first metal layer, comprises an aperture. The metal layers are arranged in the stack with respect to an optical axis such as to open an effective aperture along the optical axis. By way of the effective aperture a portion of the active area is exposed to incident photons being incident along the optical axis. The effective aperture is smaller than the aperture arranged in the first metal layer.

The proposed concept extends the practically achievable attenuation to smaller values and the linear range of the SPAD is extended as well. The effective aperture can be established by two or more metal layers and effectively blocks the active area from photons which are incident from paths other than the optical axis. Typically, photons are incident only from a certain field of view and the effective aperture may be optimized to best fit with this field of view. Furthermore, it can be shown that such a combination of two or more metal layers is particularly insensitive to alignment errors between the metal layers. Thus, the impact of misalignment between different metal layers has only minor impact on the achievable attenuation. Furthermore, the effective aperture can be smaller than a squared minimum design rule clean spacing which often defines a strict requirement that need to be met in SPAD design. Thus, the effective aperture becomes largely independent of technology constraints.

In at least one embodiment a metal layer, e.g. the first metal layer, comprises more than a single aperture. Such case may lead to several effective apertures which each expose a portion of the active area to incident photons, respectively. Each effective aperture is smaller than the corresponding apertures arranged in the first metal layer. In addition, or alternatively, one or more apertures can be provided in further metal layers, e.g. the second metal layer. In the following, features discussed with respect to a single aperture, effective aperture or metal layer can be applied to several apertures, effective apertures or metal layers if not stated otherwise.

In at least one embodiment the cover shields the active area completely from incident photons except for the portion of the active area exposed by way of the effective aperture.

In at least one embodiment the effective aperture exposes an area of the active area which is smaller than 50%, smaller than 10% or smaller than 1% of the whole active area. Thus, different levels of attenuation can be achieved. However, only the applied technology to manufacture the SPAD may limit the practically achievable attenuation which, thus, is not restricted by the example values stated above.

In at least one embodiment the metal layers are spaced with respect to each other such that the first metal layer has a first distance to the active area and the second metal layer has a second, different, distance to the active area. For example, a metal layer having one or more apertures can be located closer or further away from the active area.

In at least one embodiment the metal layers are interconnected by means of metal connections. The interconnection may be established by means of an interlayer dielectric or by means of vertical electrical connections, for example. Electrical connections may comprise through silicon vias, TSV, for example.

In at least one embodiment the second metal layer comprises an aperture. Thus, both the first and second metal layer may comprise respective apertures. In such a case the apertures in the metal layers can be offset with respect to the optical axis. Alternatively, the apertures in the metal layers can be aligned with respect to the optical axis.

In at least one embodiment the optical axis is a surface normal or an inclined axis with an angle different from the normal with respect to the active area. For example, in a case where the apertures in the metal layers are offset with respect to the optical axis, the axes may have an inclination angle different from the surface normal. In a case where the apertures in the metal layers are aligned with respect to the optical axis, the axis may be the surface normal or parallel thereto. However, the apertures in the different metal layers may be aligned with respect to several optical axes such that incident photons may not traverse along a straight path in order to reach the active area. Rather the apertures may define a path which bends one or a couple of times depending on the arrangement of aperture. This may further increase attenuation of incident radiation.

In at least one embodiment the second metal layer is arranged below or above the first metal layer. The arrangement of the metal layers is adjusted such that a projection of the second metal layer along the optical axis onto the first metal layer at least partly shields the aperture in the first metal layer to confine the effective aperture. In other words the effective aperture is defined by both the apertures in the first and the second metal layer and their relative arrangement in the stack.

In at least one embodiment a metal layer, e.g. the second metal layer, comprises a metal line, a metal cross and/or a metal square. For example, one metal layer, e.g. the first metal layer, is a planar layer which essentially comprises a shape similar to the active area of the SPAD, e.g. a square, rectangular or circular shape (it may be the same shape with equal surface area or slightly larger or smaller). Then the second metal layer (or other further metal layers) may have line, cross or square shape which can be smaller in area when compared to the planar layer of the first metal layer. If, for example, only the first metal layer has an aperture, such as a single aperture, then the metal line, metal cross and/or metal square can be arranged with respect to said aperture such to define an effective aperture which is smaller than the aperture arranged in the first metal layer, e.g. when seen as a projection along the optical axis.

In at least one embodiment the cover comprises further metal layers stacked together with the first and the second metal layer. The concepts derived so far can also be applied to one of more of these further metal layers including arrangement of apertures and effective apertures, for example.

In at least one embodiment the cover and/or active area has circular, rectangular, or polygonal shape. Similarly, one or more of the metal layers also has circular, rectangular, or polygonal shape. The specific shape allows for arranging several SPADs into arrays in a space saving manner. For example, several SPADs may be arranged in a two-dimensional packing scheme such as circular, square, rectangular or honeycomb structures.

In at least one embodiment an array of single photon avalanche diodes, SPADs, comprises a plurality of SPADs according to the concept discussed above. The individual SPADs are arranged in rows and/or columns of the array. The plurality of SPADs comprises a plurality of different subsets of SPADs. Each different subset has at least one SPAD therein with a different effective aperture. Finally, a control unit is configured to select one or more SPADs from a subset of SPADs depending on an incident radiation intensity. In fact, singles SPADs from a given subset or an entire subset can be selected or deselected.

In at least one embodiment the SPADs which are arranged into each subsets have the same effective apertures.

In at least one embodiment the effective apertures of SPADs arranged in different subsets are different.

In at least one embodiment the control unit selects one or more SPADs from a subset or from different subsets by activating or deactivating said SPAD, SPADs or the subset. In addition, or alternatively, all SPADs from a given subset or from the entire array may be activated at all times without an individual activating or deactivating. Then the control unit selects one or more SPADs by way of their output signals, e.g. output pulses.

In the following, the principle presented above is described in further detail with respect to drawings, in which exemplary embodiments are presented.

In the exemplary embodiments and Figures below, similar or identical elements may each be provided with the same reference numerals. The elements illustrated in the drawings and their size relationships among one another, however, should not be regarded as true to scale. Rather individual elements, such as layers, components, and regions, may be exaggerated to enable better illustration or improved understanding.

BRIEF DESCRIPTION OF THE DRAWINGS

FIG. 2 shows another embodiment of a single photon avalanche diode,

FIG. 4 show another embodiment of a single photon avalanche diode,

DETAILED DESCRIPTION

Figure 1:
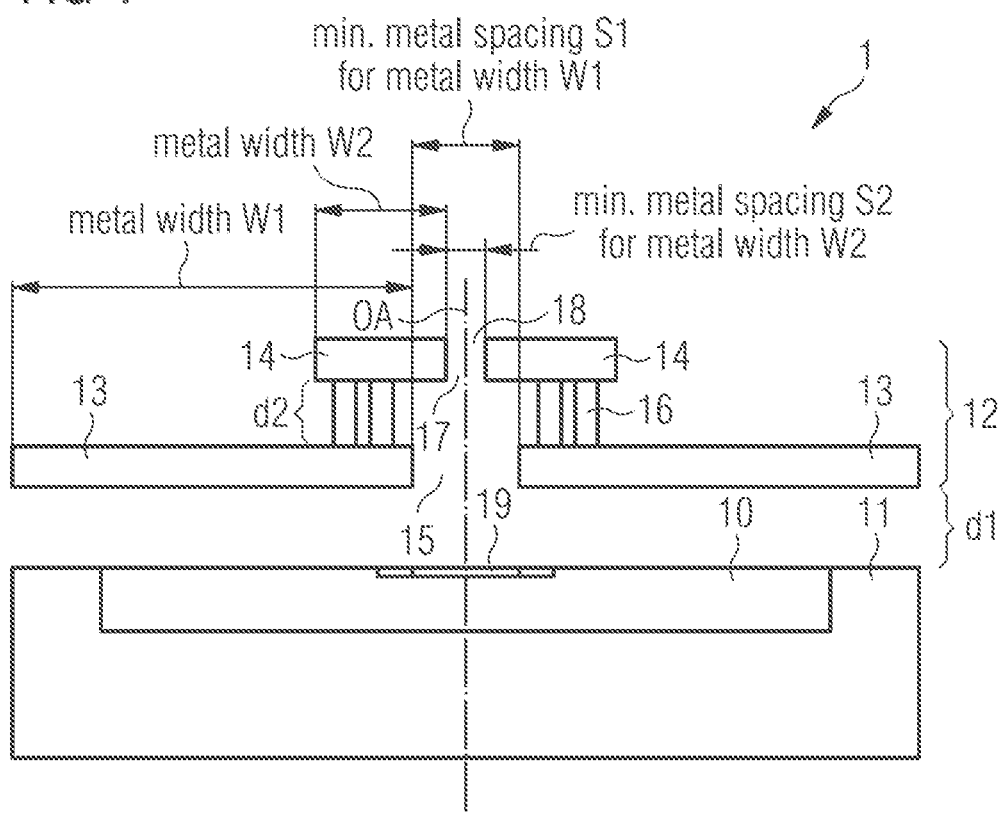
FIG. 1 shows an embodiment of a single photon avalanche diode.

FIG. 1 shows a cross-section of an embodiment of a single photo avalanche diode, SPAD. The SPAD 1 comprises an active area 10 arranged in a semiconductor substrate 11. For example, the active area 10 comprises a pn-junction that can be reverse-biased at a bias voltage that exceeds the breakdown voltage of the junction. The active area 10 further comprises additional electric components such as contact pads or a depletion layer etc., which are not shown in the drawing for reasons of easier representation. Basically, the active area 10 is arranged to trigger a self-sustaining avalanche when a single charge carrier is injected into the junction, e.g. by means of an incident photon. Furthermore, the SPAD comprises means for quenching the avalanche, e.g. by lowering the bias voltage. Operation (including quenching) of the SPAD can be controlled by a dedicated control circuit 20 (not shown).

The SPAD 1 further comprises a cover 12 which is arranged above the active area 10 at a distance d1. This distance d1 affects the optical properties of the SPAD and constitutes a design choice, i.e. its value can be set to any practical value complying with the intended application. The cover 12 comprises a stack of a first and a second metal layer 13, 14. The metal layers 13, 14 are stacked on each other with a distance d2 in-between them. This distance d2 also affects the optical properties of the SPAD 1 and constitutes a design choice, i.e. its value can be set to any practical value complying with the intended application. Basically, the cover 12 is designed to shield the active area 10 from exposure of incident photons.

In this embodiment the first metal layer 13 is closest to the active area 10. Furthermore, the first metal layer 13 comprises an area which is similar in shape and size to the active area 10, e.g. equal or larger than the active area. Thus, the first metal layer 13, arranged at distance d1, shields the active area 10 from photons which are incident on the SPAD 1 from along an optical axis OA. For example, the optical axis OA constitutes a design choice, e.g. its orientation can be designed with a specific field of view in mind. In this example embodiment the optical axis OA is defined by a surface normal of the active area 10.

The first metal layer 13 shields the active area 10 from incident photons except for an aperture 15. The aperture 15 is arranged in the metal layer 13 and may have different shapes, e.g. square, rectangular, circular etc. Typically, design rules determine a metal width W1. The metal width can be defined as the width measured from an edge of the layer to the aperture 15 as depicted in the drawing. For this metal width W1 a minimum metal spacing S1 can be defined. The minimum metal spacing S1 as well as the metal width W1 are often determined by design rules and, thus, cannot be adjusted with all degrees of freedom.

The maximum achievable attenuation is typically limited by the design rules for the used metal layer. For example, if only the first metal layer 13 were present, a SPAD with an active area of 50 $\mu m^2$ and a desired attenuation of 0.5%, could have a square aperture 15 which is required to be 0.5×0.5 $\mu m^2$. However, in some SPAD manufacturing technology this may violate the metal-to-metal spacing rules and/or the metal enclosed area rules. For example, for metal lines exceeding the minimum metal width, the minimum spacing rules are typically much larger than the possible minimum spacing in a certain technology. Furthermore, the maximum metal width and/or the maximum metal density typically is also limited.

The second metal layer 14 is arranged on top of the first metal layer 13 at a distance d2. In this embodiment the second metal layer 14 and the first metal layer 13 are interconnected by metal connections 16. In other embodiments, or additionally, an interlay dielectric can be provided between the layers. The second metal layer 14 can have different shape and may or may not have an aperture as will be discussed further below. For example, the second metal layer 14 has a similar but smaller area compared to the first metal layer 13. In this example embodiment the second metal layer 14 comprises an aperture 17. In fact, the apertures 15, 17 in the two layers are aligned or centered with respect to the optical axis OA.

The design rules of the second metal layer 14 determine a metal width W2. This metal width W2 can be defined as the width measured from an edge of the layer 14 to the aperture 17 as depicted in the drawing. For this metal width W2 a minimum metal spacing S2 can be defined. The minimum metal spacing S2 of the second metal layer 14, however, can be adjusted to a smaller value as compared to aperture 15 in the first metal layer 13. The smaller metal width W2 allows for smaller minimum metal spacing S2 and, thus, the aperture 17 can be made smaller compared to the first metal layer 13 and aperture 15, Ultimately, this allows for higher degrees of freedom in the design of the cover 12 while at the same time complying with the design rules determined by the SPAD manufacturing technology.

Together the two metal layers 13, 14 are arranged in the stack with their apertures 15, 17 aligned with respect to the optical axis OA. The arrangement opens an effective aperture 18 by which photons can traverse along the optical axis OA and eventually reach the active area 10. Thus, the effective area exposes a portion 19 of the active area 10 to incident photons. The effective aperture 18 is smaller than the aperture 15 arranged in the first metal layer 13. In fact, in this embodiment the effective aperture 18 is determined by the aperture 17 in the second metal layer 14, or, in other words, by the minimum metal spacing S2. The portion 19 which is exposed to incident photons is determined by the apertures 15, 17, i.e. minimum metal spacing's S1, S2, and the distances d1 and d2. For example, the portion 19 can be estimated by geometric optics and raytracing originating in aperture 17. The metal connections 16 connecting the two metal layers can reduce the impact of lateral stray light. Further metal layers could be provided and connected on top of the second metal layer by means of further metal connections 16. This way the effective aperture can be smaller and attenuation can be increased.

FIG. 2 shows another embodiment of a single photo avalanche diode, SPAD. The SPAD 1 shown in the top of the drawing comprises two metal layers, i.e. first metal layer 13 and second metal layer 14. Similar to FIG. 1 the first metal layer 13 comprises an aperture 15. Both the shapes of the metal layer and the aperture can be the same as in FIG. 1 or may comprise different shapes such as rectangular, circular or polygon shape, for example. The first metal layer 13 is located at a distance d1 with respect to the active area 10. Different from the embodiment of FIG. 1, however, the second metal layer 14 is located at a distance d2 which is closer to the active area 10. In other words, the second metal layer 14 is closest to the active area 10. Furthermore, the second metal layer 14 has no aperture but rather comprises a continuous shape such as a line, cross, rectangular or square, for example.

The lower part of FIG. 2 shows a top view of the SPAD. The first metal layer 13 is depicted as a continuous plane covering the active area 10 completely. Only an area below the aperture 15 is exposed to incident photons. However, the aperture 15 formed in the first metal layer 13 is crossed by a narrow metal line of the second metal layer 14. The effective aperture 18 is defined by a projection of the second metal layer 14 onto the active area 10 via the first metal layer 13. As indicated in the drawing only a portion 19 below and above the metal line of the second metal layer 14 is exposed to incident photons. In a more general consideration the location of the first and second metal layers can be exchanged such that the first metal layer 13 is closest to the active area or vice versa. This applies to all embodiments discussed herein.

Figure 3:
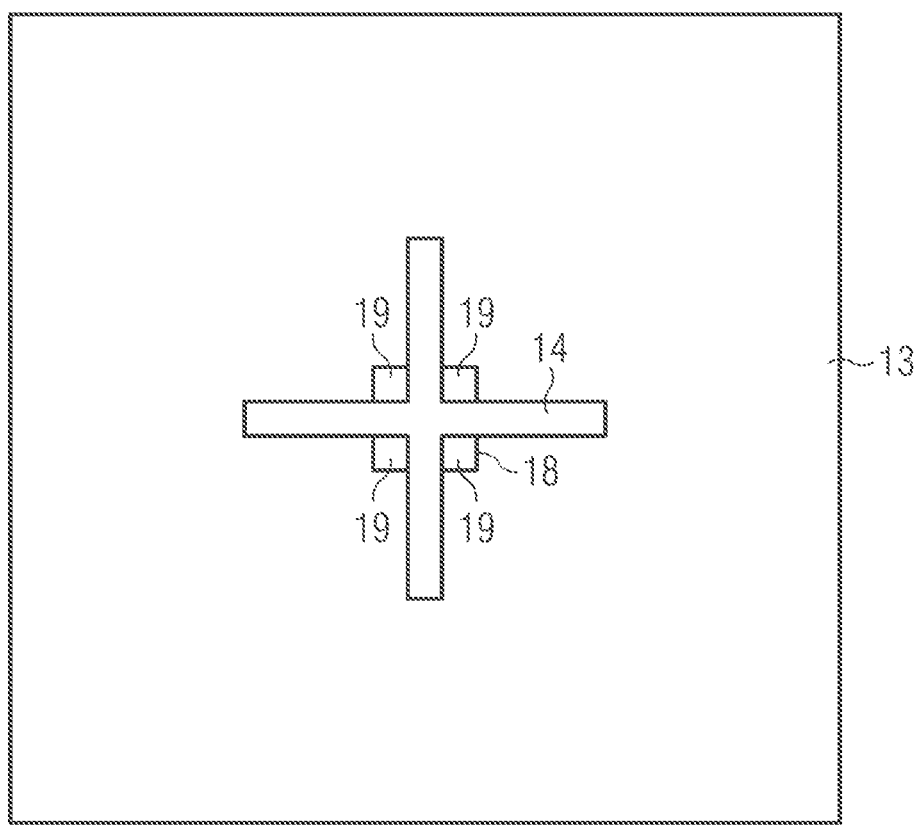
FIG. 3 shows another embodiment of a single photon avalanche diode.

FIG. 3 shows another cross-section of an embodiment of a single photo avalanche diode, SPAD. The SPAD 1 shown in the drawing is based on the embodiment of FIG. 2. The aperture 15 formed in the first metal layer 13, however, is crossed by a two perpendicular and narrow metal lines of the second metal layer 14. The two metal lines form a cross over or below the first metal layer 13. The effective aperture 18 is defined by a projection of the second metal layer 14 onto the active area 10 via the first metal layer 13. As indicated in the drawing only a portion 19 of the active area 10 is exposed to incident photons. In a more general consideration the location of the first and second metal layers can only be exchanged such that the first metal layer 13 is closest to the active area or vice versa.

FIG. 4 shows another embodiment of a single photo avalanche diode, SPAD. The SPAD 1 shown in the top of the drawing comprises two metal layers, i.e. first metal layer 13 and second metal layer 14 similar to those of FIG. 2. The first and second metal layers 13, 14 can be exchanged such that the first metal layer 13 is closest to the active area or vice versa. As can be seen in the bottom part of the drawing the second metal layer 14 has a square shape which, when seen from the top, i.e. along a projection along the optical axis OA, fits inside the aperture 15 arranged in the first metal layer 13. Thus, the aperture 15 is further reduced and the stack confines the effective aperture 18.

Figure 5:
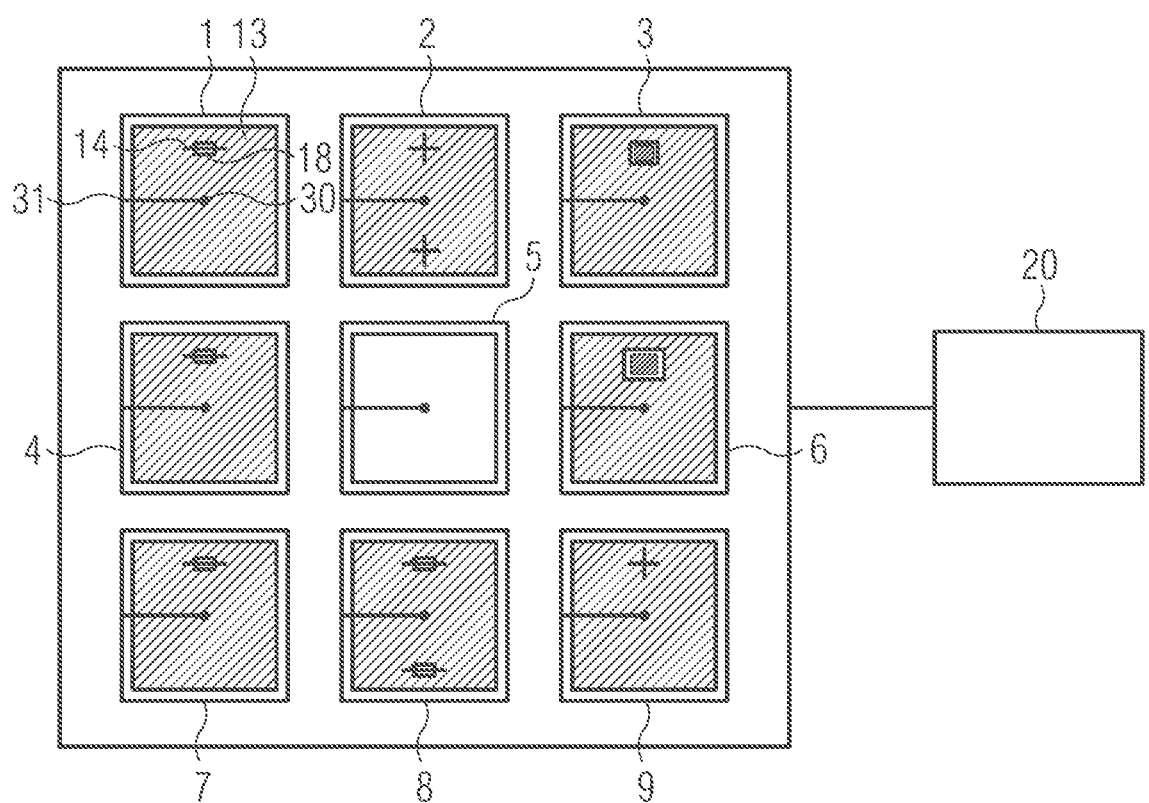
FIG. 5 shows an embodiment of an array of single photon avalanche diodes.

FIG. 5 shows an embodiment of an array of single photon avalanche diodes. The array comprises a plurality of SPADs which are arranged in a common integrated circuit 28 in a 3×3 matrix. Shown are nine SPADs 1 to 9. Each SPAD comprises a cathode guard ring region 29 which acts as a cathode, an anode 30, a track area 31 for connection to the anode and an active area 10. Only photons incident on the active area 10 can be detected by the SPAD. The active area 10 is shielded by the anode and the track area which, in turn, reduce the active area. The shape of the active area in this example comprises a square but is not limited to this particular geometry.

Some of the SPADs, but not necessarily each one of them, are implemented along the concepts presented above. In fact, all SPADs 1 to 4 and 6 to 9 comprises a cover 12 comprising at least two metal layers 13, 14. In this example embodiment SPAD 5 is arranged in a center of the array and comprises no cover 12. The remaining SPADs in the array comprises a first metal layer 13 which completely covers the active area 10 located below the layer. A portion 19 of the active area 10 is only exposed to incident photons by way of one or more apertures 15 arranged in the metal layer 13.

The SPAD's having a cover 12 can be categorized into different subsets 21 to 27. For example, SPADs 1, 4, and 7 are grouped into the first subset 21. All these SPADs have a second metal layer 14 which comprises a narrow metal line as discussed in FIG. 2. SPAD 2 comprises two apertures 15 covered by a metal cross as shown in FIG. 3. SPAD 2 constitutes a second subset 22. SPAD 3 comprises an aperture 15 covered by a metal square as shown in FIG. 4. SPAD 3 constitutes a third subset 23. Similarly, SPAD 6 comprises an aperture 15 covered by a metal square as shown in FIG. 4. However, its aperture is somewhat larger, as is the metal square. SPAD 6 constitutes a fourth subset 24. The central SPAD 5 is not covered and constitutes a fifth subset 25. SPAD 7 comprises two apertures 15 covered by a metal lines as shown in FIG. 2. SPAD 7 constitutes a sixth subset 26. Finally, SPAD 9 comprises a single aperture 15 covered by a metal cross as shown in FIG. 3. SPAD 9 constitutes a seventh subset 27.

The arrangement of the SPADs and implementation of covers shown in FIG. 5 are for illustration purposes only. The number and size of apertures as well as the shapes of the apertures and second metal layer used to cover the first metal layer can be chosen as the intended application demands and may only be restricted by the applicable design rules. Furthermore, the first metal layer 13 may be closest to the active area of a given SPAD or the second metal layer 14 may be closest. In general, the location of the metal layers are interchangeable.

An effect of the covers 12 is that portions 19 of the active area 10 are exposed to incident photons with different attenuation. In fact, as has been discussed above the respective effective apertures can be reduced to values smaller than 1%. The cover may completely cover the active areas 10 except for the one or more effective apertures 18 defined by the metal layers. In this way, the only photons detected by a given SPAD are those which pass through the effective aperture and reach the SPAD's active area.

The metal layers can be formed when forming of the metal track and anode, for example. The SPAD including the cover can be manufactured by standard CMOS technology and be integrated into a common integrated circuit. For example, a dielectric layer can be provided above the active area. In a next step metal such as aluminum can be deposited on the dielectric layer. The apertures and shapes of the given metal layer can be defined by using a mask or by etching grooves into the dielectric layer which can be filled by metal such as Cu.

The various covers 12 shown in FIG. 5 leads to different attenuation levels determined by the effective apertures 18, respectively. The number of photons which can be detected by a given SPAD is reduced due to the attenuation levels determined by the respective covers. As a consequence, the SPAD array does not need to be reset so often under varying or even high level lighting conditions. In fact, the likelihood of a photon arriving the array during a reset phase is a reduced. This has the effect that fewer photons are missed by the array and linearity can be extended even to hire incident light levels. In conclusion, the proposed SPAD array has a higher linear output response to light intensity.

A control unit 20 is implemented into or connecte to the array. The control unit 20 selects one or more SPADs from a subset or from different subsets by activating or deactivating said SPAD, SPADs or the subset. The actual selection is influenced by the incident radiation intensity. This intensity may be determined by a dedicated light sensor or by the array itself.

In addition, or alternatively, all SPADs from a given subset or from the entire array may be activated at all times without an individual activating or deactivating.

For example, a SPAD comprises means to generate a digital output pulse synchronous with the avalanche build-up, e.g. by means of an inverter. A leading edge of such output pulse marks an arrival time of a detected photon. The photon-triggered avalanche current continues until the avalanche is quenched by lowering the bias voltage down to or below the breakdown voltage of the pn-junction. The output pulses of the SPADs can be further processed, e.g. determine an intensity by counting the number of output pulses within a measurement time slot. Another processing involves measuring a time distribution of the output pulses, e.g. based on a time-to-digital converter. The control unit may determine which output pulses are subject to such signal processing by selecting or combining a set of output signals of individual SPADs or subsets while disregarding other output signals, e.g. by means of a multiplexer, logic such as OR, AND operations or the like. Individual SPADS can be activated or deactivated by means of a dedicated quenching circuit which is arranged to quench the avalanche by lowering the bias down to or below the breakdown voltage. Such a quenching circuit can also be arranged to restore the SPAD to its operative level.

In one embodiment an array comprises 128 individual spats which are arranged in a 16×8 matrix. 16×5 SPADs may have no cover and, thus, no attenuation. Furthermore, 16×2 SPADs have a cover which attenuates 10% and 16×1 SPADs have a cover that attenuates incident light down to 1%, for example. Each subset comprises more than a single SPAD in order to reduce the impact of dead pixels and further increase dynamic of the array.

Figure 6A:
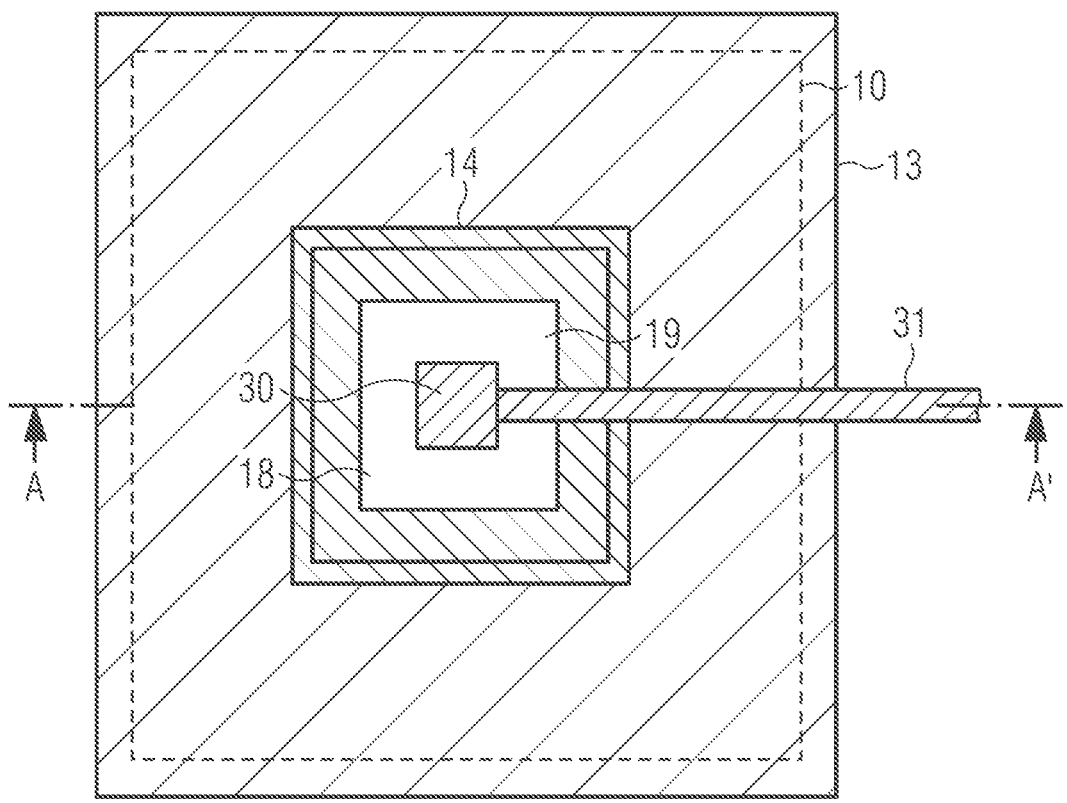
FIG. 6 shows another embodiment of a single photon avalanche diode.
Figure 6B:
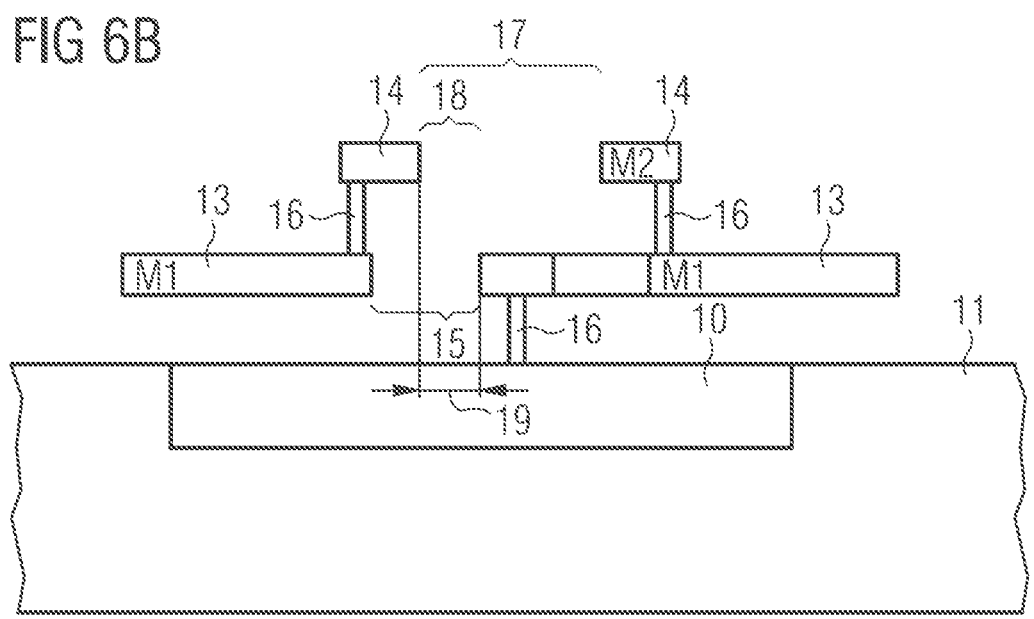

FIG. 6 shows another embodiment of a single photon avalanche diode. The drawing shows a top view (A) and a cross-section (B) along a direction A-A'.

The top view (A) shows a single SPAD which can be part of the array depicted in FIG. 5. The active area 10 (dashed lines) is covered by the first metal layer 13 except for an aperture 15. Furthermore, the second metal layer 14 is arranged on the first metal layer 13 and has a smaller area compared to the first metal layer as well as an aperture 17. Apertures 15, 17 in the first and second metal layer 13, 14 define the effective aperture 18 such that the area 19 of the active area is exposed to incident photons. Furthermore, the drawing shows an anode 30 and a track area 31 that establish an electrical connection to the active area 10. In the top view the anode 30 is arranged in the center of the effective aperture 18.

The cross-section (B) shows a cut through the SPAD along direction A-A' (see top view (A)). The active area 10 is arranged in the semiconductor substrate 11. Furthermore, the first metal layer 13 is connected to the active area by means of a metal connection 16. The second metal layer 14 is also connected to the first metal layer 13 by means of metal connections 16. In a certain sense the embodiment constitutes a combination of FIGS. 1 and 4. However, connecting the anode and metal layers by way of metal connections can be implemented in all embodiments discussed herein.

When changing the cover from an aperture where the active area is fully open to incident photons to an effective aperture where most of the active area is blocked from photons, a total capacity at the anode 30 should not change significantly. However, an additional capacity could build up at the anode and would change the total charge required to recharge the SPAD after triggering and may increase the recharge time. Also a time delay between an incident photon and the detected electrical pulse would change. Such effects could cause a different behavior for SPADs in the array with different cover and are hence not desired.

These effects can be reduced by connecting the cover with the anode or by keeping the cover floating. Connecting the cover to any other potential, such as VDD, VHV, etc., may cause an additional parasitic capacitance from the cover potential to the anode. The embodiment of FIG. 6 is one example for connecting the cover to the anode. Here the metal connection 16 to the anode is done with the same metallization as one layer of the cover.

The embodiments discussed above comprise an inner anode and a cathode implemented as a guard ring region around the anode. Generally, anode and cathode are interchangeable and can be considered as a first and second electrode, respectively. Shape and location of the electrodes may be determined in view of a disired application and is not restricted to the examples shown in the embodiments discussed above.

REFERENCE NUMERALS 1 to 9 SPADs
10 active area
11 semiconductor substrate
12 cover
13 first metal layer
14 second metal layer
15 aperture
16 metal connection
17 aperture
18 effective aperture
19 exposed portion (of the active area)
20 control unit
21 to 27 subsets of SPADs
28 integrated circuit
29 guard ring region
30 anode
31 track area
d1 distance
d2 distance
OA optical axis
S1 metal spacing
S2 metal spacing
W1 metal width
W2 metal width

The invention claimed is:

1. A single photon avalanche diode, SPAD, comprising:
an active area arranged to generate a photon-triggered avalanche current,
a cover arranged on or above the active area and shielding the active area from incident photons;
wherein:
the cover comprises a stack of at least a first and a second metal layer,
at least the first metal layer comprises an aperture,
the metal layers are arranged with respect to an optical axis such as to open an effective aperture along the optical axis by which a portion of the active area is exposed to incident photons, and
the effective aperture is smaller than the aperture arranged in the first metal layer.

2. The SPAD according to claim 1, wherein the cover shields the active area completely from incident photons except for the portion of the active area exposed by way of the effective aperture.

3. The SPAD according to claim 1, wherein the effective aperture exposes an area of the active area which is smaller than 50%, smaller than 10% or smaller than 1% of the whole active area.

4. The SPAD according to claim 1, wherein the metal layers are spaced with respect to each other such that the first metal layer has a first distance to the active area and the second metal layer has a second, different distance to the active area.

5. The SPAD according to claim 1, wherein the metal layers are interconnected by means of metal connections, or are interconnected by means of vertical electrical connections and/or a through-silicon vias, TSV.

6. The SPAD according to claim 1, wherein the second metal layer comprises an aperture such that
the apertures in the metal layers are offset with respect to the optical axis or the apertures in the metal layers are aligned with respect to the optical axis.

7. The SPAD according to claim 6, wherein the optical axis is a surface normal or an inclined axis with an angle different from the normal with respect to the active area.

8. The SPAD according to claim 1, wherein the second metal layer is arranged below or above the first metal layer such that a projection of the second metal layer along the optical axis onto the first metal layer at least partly shields the aperture in the first metal layer to confine the effective aperture.

9. The SPAD according to claim 8, wherein the second metal layer comprises a metal line, a metal cross and/or metal square.

10. The SPAD according to claim 1, wherein the cover comprises further metal layers stacked with the first and the second metal layer.

11. The SPAD according to wherein the cover and/or active area has circular, rectangular, or polygonal shape.

12. An array of single photon avalanche diodes, SPADs, comprising a plurality of SPADs according to claim 1, arranged in rows and/or columns, wherein
said plurality of SPADs comprises a plurality of different subsets of SPADs, each different subset having at least one SPAD therein with a different effective aperture; and
a control unit is configured to select one or more SPADS from a subset of SPADs depending on an incident radiation intensity.

13. The array according to claim 12, wherein the SPADs arranged into each subset have the same effective apertures.

14. The array according to claim 12, wherein the effective apertures of SPADs arranged in different subsets are different.

15. The array according to claim 12, wherein the control unit selects one or more SPADS
by activating or deactivating said SPAD or SPADs,
by activating or deactivating a one or more subsets of SPADs, and/or
all SPADs from a given subset or from the entire array may be activated at all times without an individual activating or deactivating and the control unit selects one or more SPADS by selecting an output signal or by selecting an output pulse.

* * * * *